United States Patent
Teratani et al.

(10) Patent No.: US 8,022,001 B2
(45) Date of Patent: Sep. 20, 2011

(54) ALUMINUM NITRIDE SINTERED PRODUCT, METHOD FOR PRODUCING THE SAME, AND ELECTROSTATIC CHUCK INCLUDING THE SAME

(75) Inventors: Naomi Teratani, Nagoya (JP); Toru Hayase, Nagoya (JP); Yuji Katsuda, Tsushima (JP)

(73) Assignee: NGK Insulators, Ltd., Nagoya (JP)

( * ) Notice: Subject to any disclaimer, the term of this patent is extended or adjusted under 35 U.S.C. 154(b) by 85 days.

(21) Appl. No.: 12/618,901

(22) Filed: Nov. 16, 2009

(65) Prior Publication Data
US 2010/0128409 A1  May 27, 2010

(30) Foreign Application Priority Data
Nov. 21, 2008 (JP) .................................. 2008-297438

(51) Int. Cl.
  C04B 35/581 (2006.01)
(52) U.S. Cl. ....................................... 501/98.4; 501/98.6
(58) Field of Classification Search ................. 501/98.4, 501/98.6
See application file for complete search history.

(56) References Cited

U.S. PATENT DOCUMENTS

| | | | |
|---|---|---|---|
| 5,147,832 A * | 9/1992 | Shimoda et al. | 501/98.4 |
| 5,294,388 A * | 3/1994 | Shimoda et al. | 264/674 |
| 5,306,679 A * | 4/1994 | Shimoda et al. | 501/98.4 |
| 6,607,836 B2 | 8/2003 | Katsuda et al. | |
| 7,122,490 B2 | 10/2006 | Kobayashi et al. | |
| 2010/0227145 A1* | 9/2010 | Teratani et al. | 428/220 |

* cited by examiner

*Primary Examiner* — Karl E Group
(74) *Attorney, Agent, or Firm* — Burr & Brown

(57) ABSTRACT

A method for producing an aluminum nitride sintered product according to the present invention includes the steps of (a) preparing a powder mixture that contains AlN, 2 to 10 parts by weight of $Eu_2O_3$ with respect to 100 parts by weight of AlN, $Al_2O_3$ such that a molar ratio of $Al_2O_3$ to $Eu_2O_3$ is 2 to 10, and $TiO_2$ such that a molar ratio of $TiO_2$ to $Al_2O_3$ is 0.05 to 1.2, but not Sm; (b) producing a compact from the powder mixture; and (c) firing the compact by subjecting the compact to hot-press firing in a vacuum or in an inert atmosphere.

8 Claims, 2 Drawing Sheets

EXAMPLE 6

EXAMPLE 11

COMPARATIVE EXAMPLE 10

ALUMINUM NITRIDE SINTERED PRODUCT, METHOD FOR PRODUCING THE SAME, AND ELECTROSTATIC CHUCK INCLUDING THE SAME

BACKGROUND OF THE INVENTION

1. Field of the Invention

The present invention relates to an aluminum nitride sintered product, a method for producing such an aluminum nitride sintered product, and an electrostatic chuck including such an aluminum nitride sintered product.

2. Description of the Related Art

Electrostatic chucks have been used for holding wafers in semiconductor manufacturing equipment. Such electrostatic chucks include an internal electrode for applying a voltage and a dielectric layer placed on the internal electrode. When a wafer is placed on the dielectric layer and a voltage is applied to the internal electrode, an electrostatic attractive force is produced between the wafer and the dielectric layer. There are electrostatic chucks employing a monopolar system in which one internal electrode is contained and electrostatic chucks employing a bipolar system in which a pair of (that is, two) internal electrodes are contained so as to be spaced apart from each other. An electrostatic chuck employing the monopolar system is configured to produce an electrostatic attractive force by applying a voltage between the internal electrode of the electrostatic chuck and an external electrode placed outside the electrostatic chuck. An electrostatic chuck employing the bipolar system is configured to produce an electrostatic attractive force by applying a voltage to a pair of internal electrodes. As for such electrostatic chucks, there is a Johnson-Rahbeck type in which a wafer is attracted with a Johnson-Rahbeck force produced using a dielectric having a volume resistivity of about $10^8$ to $10^{12} \Omega \cdot cm$.

Materials usable for such a Johnson-Rahbeck type electrostatic chuck are, for example, aluminum nitride sintered products disclosed in Documents 1 and 2. Specifically, Document 1 discloses an aluminum nitride sintered product containing aluminum nitride as a main component, containing 0.04 mol % or more samarium in terms of oxide, and including an aluminum nitride phase and a samarium-aluminum oxide phase. Document 2 discloses an aluminum nitride sintered product containing aluminum nitride as a main component, containing 0.03 mol % or more europium in terms of oxide, and including an aluminum nitride phase and a europium-aluminum oxide phase; and also an aluminum nitride sintered product containing samarium.

Document 1: U.S. Pat. No. 6,607,836 B
Document 2: U.S. Pat. No. 7,122,490 B

SUMMARY OF THE INVENTION

Although Document 1 describes in Examples many aluminum nitride sintered products having a volume resistivity of $1 \times 10^{12} \Omega \cdot cm$ or less at room temperature and an activation energy (Ea) of 0.4 eV or less, samarium is a rare element and is not necessarily available with stability. For this reason, there has been a demand for the development of an aluminum nitride sintered product that does not contain samarium and has properties equivalent to those of an aluminum nitride sintered product that contains samarium. In this respect, Document 2 describes examples of an aluminum nitride sintered product without containing samarium in Examples 1 to 6. However, these sintered products have a volume resistivity of more than $1 \times 10^{12} \Omega \cdot cm$ at room temperature or an activation energy (Ea) of more than 0.6 eV. That is, these sintered products have properties somewhat inferior to the properties of the sintered products in Document 1. Such a high volume resistivity at room temperature is not preferred because an electrostatic chuck formed with such a sintered product does not provide a high attractive force or does not allow quick detachment as a result of slow discharge of charge upon stopping application of a voltage. High activation energy (Ea) results in a large rate (gradient) of decrease in volume resistivity with an increase in temperature. For this reason, there is a possibility that volume resistivity decreases to a value less than that required for the Johnson-Rahbeck type in high temperature. Therefore, high activation energy leads to a narrow operation temperature range, which is not preferred.

The present invention has been accomplished in view of the above drawbacks and a major object of the present invention is to provide an aluminum nitride sintered product that does not contain samarium and has properties equivalent to those of an aluminum nitride sintered product that contains samarium.

To achieve the above-described object, the inventors of the present invention produced a compact with a powder obtained by mixing aluminum nitride serving as a main component with europium oxide, aluminum oxide, and titanium oxide, but not a samarium compound; and subjected the compact to hot-press firing. As a result, they have found that a sintered product that has properties equivalent to those of an aluminum nitride sintered product that contains samarium can be obtained. Thus, the present invention has been accomplished.

Specifically, a method for producing an aluminum nitride sintered product according to the present invention includes the steps of:

(a) preparing a powder mixture that contains aluminum nitride, 2 to 10 parts by weight of europium oxide with respect to 100 parts by weight of aluminum nitride, aluminum oxide such that a molar ratio of aluminum oxide to europium oxide is 2 to 10, and titanium oxide such that a molar ratio of titanium oxide to aluminum oxide is 0.05 to 1.2, but not a samarium compound;

(b) producing a compact from the powder mixture; and (c) firing the compact by (1) subjecting the compact to hot-press firing in a vacuum or in an inert atmosphere or (2) subjecting the compact to hot-press firing in a vacuum or in an inert atmosphere and subsequently to an annealing treatment at a temperature higher than a temperature in the firing.

An aluminum nitride sintered product according to the present invention is produced by the above-described method for producing an aluminum nitride sintered product; and/or includes a continuous grain boundary phase having peaks corresponding to $EuAl_{12}O_{19}$ and a crystal phase having peaks corresponding to TiN, but not a crystal phase derived from Sm; has a volume resistivity of $1 \times 10^{12} \Omega \cdot cm$ or less at 500 V/mm at room temperature; and has an activation energy (Ea) of 0.5 eV or less, the activation energy being obtained on the basis of a variation in volume resistivity from room temperature to 300° C.

An electrostatic chuck according to the present invention is produced with the above-described aluminum nitride sintered product.

The method for producing an aluminum nitride sintered product according to the present invention provides an aluminum nitride sintered product that contains aluminum nitride as a main component; includes a continuous grain boundary phase having peaks corresponding to $EuAl_2O_{19}$ and a crystal phase having peaks corresponding to TiN, but not a crystal phase containing Sm; has a volume resistivity of $1 \times 10^{12} \Omega \cdot cm$ or less at 500 V/mm at room temperature; and has an activation energy (Ea) of 0.5 eV or less, the activation energy being obtained on the basis of a variation in volume resistivity from room temperature to 300° C. That is, the method provides an aluminum nitride sintered product that does not contain samarium and has properties equivalent to those of an aluminum nitride sintered product that contains samarium. Like samarium, europium is also a rare-earth element and rare. However, the present invention allows appropriate selection between europium and samarium and hence, if the situation where one of these elements may be exhausted occurs in the future, the other element can be used as an alternative. An aluminum nitride sintered product according to the present invention is suitable as a material for a member for semiconductor manufacturing equipment such as a Johnson-Rahbeck type electrostatic chuck.

BEST MODE FOR CARRYING OUT THE INVENTION

Figure 1:
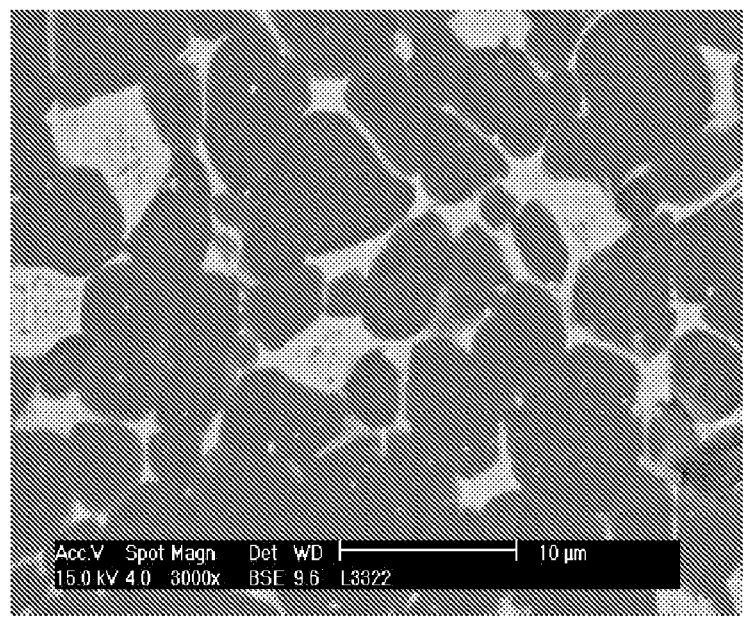
FIG. 1 shows SEM images of sections of aluminum nitride sintered products of Examples 6 and 11.
Figure 1:
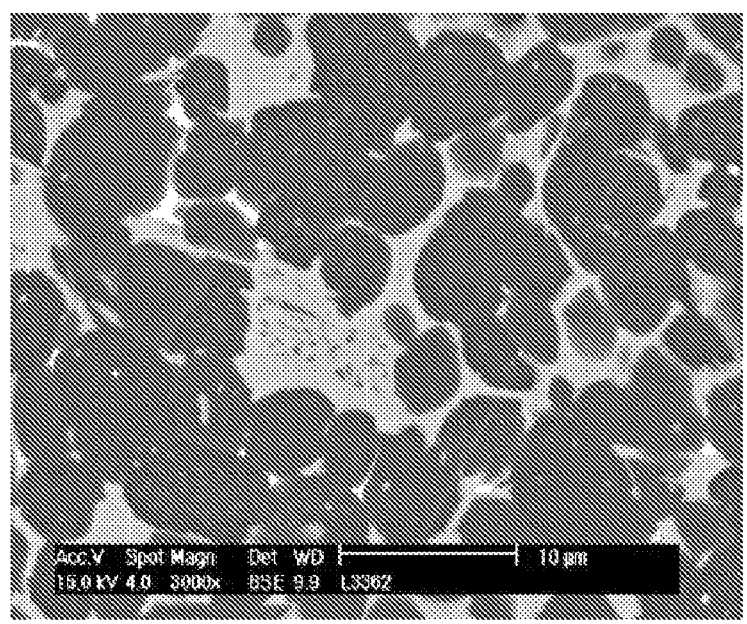

In the step (a) of a method for producing an aluminum nitride sintered product according to the present invention, a powder mixture is prepared that contains aluminum nitride, 2 to 10 parts by weight of europium oxide with respect to 100 parts by weight of aluminum nitride, aluminum oxide such that a molar ratio of aluminum oxide to europium oxide is 2 to 10, and titanium oxide such that a molar ratio of titanium oxide to aluminum oxide is 0.05 to 1.2, but not a samarium compound. In this step (a), the powder mixture can be obtained by, for example, wet blending the above-described components in an organic solvent to provide slurry and drying the slurry. The wet blending may be conducted with a mixing mill such as a pot mill, a trommel, or an attrition mill. Alternatively, dry blending may be conducted instead of the wet blending.

In the step (a), the case where the amount of europium oxide used is less than 2 parts by weight with respect to 100 parts by weight of aluminum nitride is not preferred because the resultant aluminum nitride sintered product may have a volume resistivity of more than $1 \times 10^{12} \Omega \cdot cm$ at room temperature. The amount of more than 10 parts by weight is also not preferred because there is a possibility that characteristics of aluminum nitride serving as a main component are not sufficiently provided. More preferably, the amount of europium oxide used is 3 to 5 parts by weight with respect to 100 parts by weight of aluminum nitride.

In the step (a), the case where aluminum oxide is used in an amount such that a molar ratio of aluminum oxide to europium oxide is less than 2 is not preferred because there is a possibility that the amount of $EuAl_{12}O_{19}$ having electrical conductive properties in the resultant aluminum nitride sintered product becomes too small. The case where the molar ratio is more than 10 is also not preferred because unreacted aluminum oxide remains in large amount after sintering, which results in low thermal conductivity. Note that $EuAl_{12}O_{19}$ having electrical conductive properties in a material according to the present invention is a crystal phase having peaks corresponding to the peaks described in JCPDS Card (26-1125), and also includes, for example, $EuAl_{11}O_{18}$ that has less oxygen and $EuAl_{12}O_{18}N$ that has nitrogen instead of part of oxygen.

In the step (a), when titanium oxide is used in an amount such that a molar ratio of titanium oxide to aluminum oxide is in the range of 0.05 to 1.2, reaction between titanium oxide and aluminum nitride results in transformation into aluminum oxide and titanium nitride and oxidation of aluminum nitride, which presumably contributes to generation of conductive $EuAl_{12}O_{19}$ forming a grain boundary phase and results in formation of a continuous grain boundary phase. There is a high probability that the titanium nitride generated above contains oxygen. When oxygen components are provided from aluminum oxide instead of titanium oxide, low activation energy is not obtained. Thus, addition of titanium oxide presumably strongly influences the reduction of activation energy. The case where titanium oxide is used in an amount such that a molar ratio of titanium oxide to aluminum oxide is less than 0.05 is not preferred because there is a possibility that the resultant aluminum nitride sintered product has an activation energy (Ea) of more than 0.5 eV or a volume resistivity of more than $1 \times 10^{12} \Omega \cdot cm$ at room temperature. This is presumably because $EuAl_{12}O_{19}$ grain boundary phase having electrical conductive properties is not generated in a sufficiently large amount or the grain boundary phase is not continuously formed. When the molar ratio is more than 1.2, there is a possibility that the activation energy (Ea) of the resultant aluminum nitride sintered product becomes more than 0.5 eV and titanium becomes the source of contamination in semiconductor processes. For these reasons, addition of titanium oxide in too large an amount is not preferred.

In the step (b) of a method for producing an aluminum nitride sintered product according to the present invention, a compact is produced from the powder mixture obtained in the step (a). In the step (b), the compact is preferably produced from the powder mixture by uniaxial pressing. Since uniaxial pressing is conducted by charging a powder mixture into a mold and pressing the powder mixture in the vertical direction, the resultant compact has a high density. Uniaxial pressing is also suitable for the case where high dimensional accuracy is required.

In the step (c) of a method for producing an aluminum nitride sintered product according to the present invention, the compact is fired by (1) subjecting the compact to hot-press firing in a vacuum or in an inert atmosphere or (2) subjecting the compact to hot-press firing in a vacuum or in an inert atmosphere and subsequently to an annealing treatment at a temperature higher than a temperature in the firing.

As for a condition of the hot-press firing in a vacuum or in an inert atmosphere in (1) of the step (c), pressure applied by pressing is preferably 50 to 300 kgf/cm². When the pressure applied by pressing is more than the upper limit of this range, a liquefied grain boundary phase containing conductive $EuAl_{12}O_{19}$ is excessively ejected from the spaces among aluminum nitride grains. When a grain boundary phase is thus ejected, a grain boundary phase in an amount necessary for forming a continuous grain boundary phase is not obtained and a discontinuous grain boundary phase is formed. This results in too high volume resistivity at room temperature, which is not preferable. When the pressure applied by pressing is less than the lower limit of the range, a grain boundary phase has low flowability and does not sufficiently wet the periphery of aluminum nitride grains. This results in too high volume resistivity at room temperature or too high activation energy (Ea), which is not preferable. The temperature in the firing needs to be a temperature at which a conductive grain boundary phase can be turned into a liquid phase, and is preferably, for example, 1900° C. to 1950° C. When the temperature in the firing is too high, a liquefied grain boundary phase containing conductive $EuAl_{12}O_{19}$ is excessively ejected from the spaces among aluminum nitride grains. In this case, a grain boundary phase in an amount necessary for forming a continuous grain boundary phase is not obtained and this results in too high volume resistivity at room temperature, which is not preferable. When the temperature in the firing is too low, the reaction between titanium oxide added and aluminum nitride does not occur sufficiently and conductive $EuAl_{12}O_{19}$ is not sufficiently generated, or a grain boundary phase has low flowability and does not sufficiently wet the periphery of aluminum nitride grains. In consideration of these circumstances, the temperature in the firing and the pressure applied by pressing are determined within the appropriate ranges. As a result, suppression of ejection of a melted grain boundary phase from the spaces among aluminum nitride grains to outside of the sintered product upon hot-press firing can be achieved, and the grain boundary phase can sufficiently wet the periphery of aluminum nitride grains, and a continuous grain boundary phase is formed. More preferably, the temperature in the firing is set in the range of 1900° C. to 1920° C. More preferably, the pressure applied by pressing is set in the range of 100 to 200 kgf/cm². The period for the hot-press firing may be appropriately set in consideration of the above-described circumstances; however, the period is preferably 1 to 5 hours, more preferably, 2 to 4 hours. Although the hot-press firing is conducted in a vacuum or in an inert atmosphere, this firing may be conducted such that a vacuum atmosphere is used while the temperature is increased from room temperature to a predetermined temperature (for example, 1000° C. or 1550° C.) and an inert atmosphere is used while the temperature is increased from the predetermined temperature to the firing temperature and the firing temperature is maintained. Note that the predetermined temperature may be equal to the firing temperature. Herein, the inert atmosphere should be a gas atmosphere that does not influence the firing, and examples of such an inert atmosphere include nitrogen atmosphere, helium atmosphere, and argon atmosphere. Introduction of such an inert atmosphere further enhances uniform distribution of heat particularly in production of large sintered products, and uniform sintered products can be obtained.

In (2) of the step (c), as to a condition of the hot-press firing in a vacuum or in an inert atmosphere, pressure applied by pressing is preferably 50 to 300 kgf/cm²; as to a condition of the annealing treatment after the hot-press firing, the annealing temperature is preferably set 10° C. to 100° C. higher than the firing temperature. As a result, the resultant volume resistivity at room temperature is decreased by an order of magnitude and the resultant activation energy (Ea) is further decreased, compared with (1) of the step (c). The firing temperature is preferably set within the range of 1800° C. to 1890° C. in which the reaction between titanium oxide and aluminum nitride can occur and densification can be achieved, more preferably, within the range of 1865° C. to 1885° C. More preferably, the pressure applied by pressing is set within the range of 100 to 200 kgf/cm². The annealing temperature should be a temperature at which a grain boundary phase is turned into a liquid phase, and is preferably set within the range of 1900° C. to 1920° C. The period for the hot-press firing is preferably 1 to 5 hours, more preferably, 2 to 4 hours. The period for the annealing treatment is also preferably 1 to 5 hours, more preferably, 2 to 4 hours. Although the hot-press firing is conducted in a vacuum or in an inert atmosphere, this firing may be conducted such that a vacuum atmosphere is used while the temperature is increased from room temperature to a predetermined temperature (for example, 1000° C. or 1550° C.) and an inert atmosphere is used while the temperature is increased from the predetermined temperature to the firing temperature and the firing temperature is maintained. Note that the predetermined temperature may be equal to the firing temperature. The annealing treatment is conducted in an inert atmosphere. This is because there is a possibility that an annealing treatment in a high vacuum may result in gasification of liquefied grain boundary phase components and loss of the components. Introduction of an inert atmosphere further enhances uniform distribution of heat upon the annealing, and hence introduction of an inert atmosphere is suitable for providing uniform sintered products.

An aluminum nitride sintered product according to the present invention is a sintered product that is produced by the above-described method for producing an aluminum nitride sintered product; and/or includes a continuous grain boundary phase having peaks corresponding to $EuAl_{12}O_{19}$, a crystal phase having peaks corresponding to TiN, but not a crystal phase containing Sm, has a volume resistivity of $1\times10^{12}\Omega\cdot cm$ or less at 500 V/mm at room temperature, and has an activation energy (Ea) of 0.5 eV or less, the activation energy being obtained from a variation in volume resistivity from room temperature to 300° C.

An aluminum nitride sintered product having an activation energy (Ea) of 0.5 eV or less has a higher ratio of the intensity of the peak (peak for h, k, l=107) at about 34° to the intensity of a peak of $EuAl_{12}O_{19}$ in an XRD profile than in an aluminum nitride sintered product having an activation energy of more than 0.5 eV. For example, an aluminum nitride sintered product having an activation energy of more than 0.5 eV in spite of having a grain boundary phase in a sufficiently large amount and a volume resistivity of $1\times10^{12}\Omega\cdot cm$ or less, has an extremely weak 107 peak of $EuAl_{12}O_{19}$ and this peak is under the peak of aluminum nitride and does not clearly appear. In contrast, for a material according to the present invention, the 107 peak clearly appears and, for example, the ratio of the intensity of the 107 peak to the intensity of the 101 peak calculated from the intensities at the tops of the peaks is 1 or more. The reason for this is not known; however, presumably because there is a portion where crystals are oriented in a particular direction different from the main orientation when the activation energy (Ea) is high. Note that the 101 peak is a peak for h, k, l=101 and is present at about 19°.

An electrostatic chuck according to the present invention is produced with the above-described aluminum nitride sintered product. Such an aluminum nitride sintered product has a volume resistivity of $1\times10^{12}\Omega\cdot cm$ or less at 500 V/mm at room temperature, and has an activation energy (Ea) of 0.5 eV or less, the activation energy being obtained from a variation in volume resistivity from room temperature to 300° C. For this reason, an electrostatic chuck formed with such an aluminum nitride sintered product provides a high attractive force and allows for quick detachment as a result of rapid discharge of charge upon stopping application of a voltage. Because of the low activation energy (Ea), a rate (gradient) of decrease in volume resistivity with an increase in temperature is small, and volume resistivity required for the Johnson-Rahbeck type can be maintained in a wide temperature range.

Examples

Hereinafter, Examples and Comparative Examples are described. In Examples and Comparative Examples, as to aluminum nitride powder, a commercially available reduced aluminum nitride powder (average particle diameter: 1 μm, oxygen content: 0.87 wt %) was used. As to europium oxide powder, a commercially available powder having a purity of 99.9% or more and an average particle diameter of 2 μm or less was used. As to aluminum oxide powder, a commercially available powder having a purity of 99.99% or more and an average particle diameter of 0.6 μm was used. As to titanium oxide powder, a commercially available powder having a purity of 99% or more was used. The average particle diameters of the material powders were determined by laser diffraction method.

Example 1

(1) Preparation of Prepared Powder

The aluminum nitride powder, the europium oxide powder, the aluminum oxide powder, and the titanium oxide powder were weighed in respective proportions of 100 parts by weight, 3.0 parts by weight, 8.7 parts by weight, and 0.4 parts by weight. These weighed powders were wet blended with isopropyl alcohol serving as a solvent with a nylon pot and nylon balls for 4 hours. The molar ratio of the titanium oxide to the aluminum oxide was 0.05. The molar ratio of the aluminum oxide to the europium oxide was 10.0. After the blending, the resultant slurry was taken out, dried under nitrogen flow at 110° C., and subsequently sifted through a 30-mesh sieve to provide prepared powder. The resultant prepared powder was heat-treated at 450° C. for 5 hours or more in the air atmosphere to thereby burn and remove carbon components entering during the wet blending.

(2) Production of Compact

The prepared powder was compacted by uniaxial pressing at a pressure of 200 kgf/cm$^2$ to produce a disc-shaped compact having a diameter of about 50 mm and a thickness of about 20 mm. This compact was put into a graphite mold for firing.

(3) Firing

Firing was conducted by hot pressing. The pressure applied by the pressing was 200 kgf/cm$^2$. The hot-press firing temperature was 1920° C. and this temperature was maintained for 4 hours. As for atmosphere upon the firing, a vacuum was used while the temperature was increased from room temperature to 1000° C. and nitrogen gas at 1.5 kgf/cm$^2$ was subsequently introduced while the temperature was increased from 1000° C. to the hot-press firing temperature and the hot-press firing temperature was maintained. In this way, an aluminum nitride sintered product of Example 1 was obtained. The composition and other production conditions of Example 1 is shown in Table 1 along with those of other examples.

The resultant sintered product was processed and measured in terms of the following items. The measurement results are shown in Table 2. In Table 2, "E" represents a power of 10. For example, "1E+12" represents "1×10$^{12}$".

Contents of Eu and Ti

The contents were determined by inductively coupled plasma (ICP) emission spectroscopy.

Content of O

The content was determined by the inert gas fusion infrared absorption method.

Open Porosity and Bulk Density

Open porosity and bulk density were measured by the Archimedes method with pure water serving as a medium.

Volume Resistivity

Volume resistivity was measured by a method in accordance with JIS C2141 in the air at room temperature. A sample piece was prepared to have a diameter of 50 mm and a thickness of 0.5 to 1 mm. Electrodes were formed of silver such that a main electrode had a diameter of 20 mm, a guard electrode had an inner diameter of 30 mm and an outer diameter of 40 mm, and an application electrode had a diameter of 40 mm. A voltage of 500 V/mm was applied. The current after the lapse of 1 minute from the application of the voltage was determined and the volume resistivity was calculated from the current.

Activation Energy (Ea)

Activation energy Ea was determined from an Arrhenius plot. Specifically, volume resistivity ρ was determined at two or more temperatures, preferably about four temperatures (for example, four temperatures: room temperature, 100° C., 200° C., and 300° C.) in the range of room temperature to 300° C. Natural logarithm ln σ of the reciprocal of the volume resistivity ρ (electric conductivity σ) was plotted along the ordinate and 1/T (T represents the absolute temperature) was plotted along abscissa. The gradient (Ea/k) was determined in terms of the resultant points by the least squares method on the basis of the following formula. Thus, activation energy Ea was determined.

$$\ln \sigma = A - (Ea/kT).$$

where σ represents electric conductivity, k represents the Boltzmann constant, T represents the absolute temperature, and A represents a constant.

Thermal Conductivity

Thermal conductivity was determined by the laser flash method.

Crystal Phase

Crystal phases were identified with a rotating anode X-ray diffractometer (RINT manufactured by Rigaku Corporation). Measurement conditions were CuK α, 50 kV, 300 mA, and 2θ=10-70°.

TABLE 1

| | Parts by weight | | | | | | Molar ratio | Molar ratio | Hot press firing temperature | Maintaining hour | Pressing pressure | Annealing temperature |
|---|---|---|---|---|---|---|---|---|---|---|---|---|
| | AlN | Eu$_2$O$_3$ | Sm$_2$O$_3$ | Al$_2$O$_3$ | TiO$_2$ | TiN | TiO$_2$/Al$_2$O$_3$ | Al$_2$O$_3$/Eu$_2$O$_3$ | (° C.) | (hrs) | (kg/cm$^2$) | (° C.) |
| EXAMPLE 1 | 100 | 3.0 | — | 8.7 | 0.4 | — | 0.05 | 10.00 | 1920 | 4 | 200 | — |
| EXAMPLE 2 | 100 | 3.0 | — | 6.1 | 3.0 | — | 0.62 | 7.06 | 1920 | 4 | 200 | — |
| EXAMPLE 3 | 100 | 3.0 | — | 3.8 | 3.0 | — | 1.01 | 4.37 | 1900 | 4 | 100 | — |
| EXAMPLE 4 | 100 | 5.0 | — | 3.0 | 1.0 | — | 0.43 | 2.06 | 1900 | 2 | 100 | — |
| EXAMPLE 5 | 100 | 5.0 | — | 6.3 | 1.0 | — | 0.20 | 4.36 | 1900 | 2 | 100 | — |
| EXAMPLE 6 | 100 | 5.0 | — | 13.6 | 1.0 | — | 0.09 | 9.41 | 1900 | 2 | 100 | — |
| EXAMPLE 7 | 100 | 5.0 | — | 11.9 | 3.0 | — | 0.32 | 8.24 | 1900 | 2 | 100 | — |

TABLE 1-continued

| | Parts by weight | | | | | | Molar ratio | Molar ratio | Hot press firing temperature | Maintaining hour | Pressing pressure | Annealing temperature |
|---|---|---|---|---|---|---|---|---|---|---|---|---|
| | AlN | Eu$_2$O$_3$ | Sm$_2$O$_3$ | Al$_2$O$_3$ | TiO$_2$ | TiN | TiO$_2$/Al$_2$O$_3$ | Al$_2$O$_3$/Eu$_2$O$_3$ | (° C.) | (hrs) | (kg/cm$^2$) | (° C.) |
| EXAMPLE 8 | 100 | 5.0 | — | 10.2 | 5.0 | — | 0.62 | 7.01 | 1900 | 2 | 100 | — |
| EXAMPLE 9 | 100 | 5.0 | — | 13.6 | 1.0 | — | 0.09 | 9.41 | 1920 | 2 | 100 | — |
| EXAMPLE 10 | 100 | 5.0 | — | 11.9 | 3.0 | — | 0.32 | 8.24 | 1920 | 2 | 100 | — |
| EXAMPLE 11 | 100 | 5.0 | — | 13.6 | 1.0 | — | 0.09 | 9.41 | 1875 | 2 | 100 | 1900 |
| EXAMPLE 12 | 100 | 5.0 | — | 11.9 | 3.0 | — | 0.32 | 8.24 | 1875 | 2 | 100 | 1900 |
| EXAMPLE 13 | 100 | 5.0 | — | 10.2 | 5.0 | — | 0.62 | 7.07 | 1875 | 2 | 100 | 1900 |
| COMPARATIVE EXAMPLE 1 | 100 | 1.0 | — | — | — | — | — | — | 1900 | 4 | 200 | — |
| COMPARATIVE EXAMPLE 2 | 100 | — | 1.0 | — | — | — | — | — | 1900 | 4 | 200 | — |
| COMPARATIVE EXAMPLE 3 | 100 | 0.5 | — | 1.6 | — | — | — | 11.00 | 1900 | 4 | 200 | — |
| COMPARATIVE EXAMPLE 4 | 100 | — | 0.5 | 1.6 | — | — | — | — | 1900 | 4 | 200 | — |
| COMPARATIVE EXAMPLE 5 | 100 | 3.0 | — | 9.6 | — | — | — | 11.00 | 1900 | 4 | 200 | — |
| COMPARATIVE EXAMPLE 6 | 100 | 1.5 | 3.5 | 15.9 | — | — | — | 36.58 | 1900 | 4 | 200 | — |
| COMPARATIVE EXAMPLE 7 | 100 | 2.5 | 2.5 | 15.2 | — | 4.0 | — | 20.94 | 1910 | 2 | 200 | — |
| COMPARATIVE EXAMPLE 8 | 100 | 3.0 | — | 5.5 | — | 3.9 | — | 6.33 | 1920 | 4 | 200 | — |
| COMPARATIVE EXAMPLE 9 | 100 | 3.0 | — | 4.4 | 5.0 | — | 1.44 | 5.11 | 1900 | 2 | 100 | — |
| COMPARATIVE EXAMPLE 10 | 100 | 5.0 | — | 13.6 | 1.0 | — | 0.09 | 9.41 | 1875 | 2 | 100 | — |

TABLE 2

| | Content (wt %) | | | Open porosity | Bulk density | Volume resistivity | Ea | Thermal conductivity | | EuAl$_{12}$O$_{19}$ |
|---|---|---|---|---|---|---|---|---|---|---|
| | Eu | Ti | O | (%) | (g/cm$^3$) | (Ω·cm) | (eV) | (W/m·K) | Crystal phase other than AlN | (101/107) |
| EXAMPLE 1 | 1.32 | 0.19 | 4.10 | 0.03 | 3.30 | 2.7E+10 | 0.39 | 62 | EuAl$_{12}$O$_{19}$•TiN | 1.4 |
| EXAMPLE 2 | 1.66 | 1.58 | 4.32 | 0.03 | 3.34 | 1.3E+10 | 0.39 | 60 | EuAl$_{12}$O$_{19}$•TiN | 1.3 |
| EXAMPLE 3 | 1.69 | 1.53 | 4.46 | 0.02 | 3.35 | 5.5E+11 | 0.43 | 65 | EuAl$_{12}$O$_{19}$•TiN | 1.3 |
| EXAMPLE 4 | 2.35 | 0.53 | 2.42 | 0.03 | 3.30 | 7.3E+10 | 0.40 | 63 | EuAl$_{12}$O$_{19}$•EuAl$_2$O$_4$•TiN | 1.7 |
| EXAMPLE 5 | 2.32 | 0.51 | 3.56 | 0.07 | 3.29 | 7.1E+10 | 0.42 | 61 | EuAl$_{12}$O$_{19}$•EuAl$_2$O$_4$•TiN | 1.2 |
| EXAMPLE 6 | 2.29 | 0.51 | 6.05 | 0.04 | 3.33 | 1.2E+11 | 0.47 | 64 | EuAl$_{12}$O$_{19}$•Al$_5$O$_6$N•Al$_9$O$_3$N$_7$•TiN | 1.1 |
| EXAMPLE 7 | 2.30 | 1.52 | 5.78 | 0.03 | 3.36 | 1.6E+11 | 0.47 | 58 | EuAl$_{12}$O$_{19}$•Al$_5$O$_6$N•Al$_9$O$_3$N$_7$•TiN | 1.1 |
| EXAMPLE 8 | 2.46 | 2.44 | 6.13 | 0.01 | 3.33 | 1.8E+11 | 0.47 | 59 | EuAl$_{12}$O$_{19}$•Al$_5$O$_6$N•Al$_9$O$_3$N$_7$•TiN | 1.1 |
| EXAMPLE 9 | 1.72 | 0.53 | 5.40 | 0.08 | 3.33 | 3.0E+10 | 0.41 | 62 | EuAl$_{12}$O$_{19}$•Al$_5$O$_6$N•Al$_9$O$_3$N$_7$•TiN | 1.3 |
| EXAMPLE 10 | 1.76 | 1.49 | 5.32 | 0.05 | 3.36 | 3.9E+10 | 0.43 | 63 | EuAl$_{12}$O$_{19}$•Al$_5$O$_6$N•Al$_9$O$_3$N$_7$•TiN | 1.3 |
| EXAMPLE 11 | 3.44 | 0.48 | 7.41 | 0.09 | 3.35 | 4.8E+09 | 0.39 | 57 | EuAl$_{12}$O$_{19}$•Al$_9$O$_3$N$_7$•TiN | 1.2 |
| EXAMPLE 12 | 3.38 | 1.58 | 7.35 | 0.05 | 3.37 | 2.7E+10 | 0.38 | 55 | EuAl$_{12}$O$_{19}$•Al$_9$O$_3$N$_7$•TiN | 1.1 |
| EXAMPLE 13 | 3.41 | 2.53 | 7.37 | 0.04 | 3.39 | 2.5E+10 | 0.39 | 54 | EuAl$_{12}$O$_{19}$•Al$_9$O$_3$N$_7$•TiN | 1.2 |
| COMPARATIVE EXAMPLE 1 | 0.74 | — | 0.74 | 0.01 | 3.27 | 1.6E+12 | 0.39 | 106 | EuAl$_{12}$O$_{19}$•EuAl$_2$O$_4$ | *1 |
| COMPARATIVE EXAMPLE 2 | — | — | 0.72 | 0.06 | 3.27 | 4.3E+10 | 0.38 | 108 | SmAl$_{11}$O$_{18}$•SmAlO$_3$ | *1 |
| COMPARATIVE EXAMPLE 3 | 0.39 | — | 1.52 | 0.01 | 3.26 | 5.7E+12 | 0.65 | 77 | EuAl$_{12}$O$_{19}$•Al$_5$O$_5$N | 1.8 |
| COMPARATIVE EXAMPLE 4 | — | — | 1.46 | 0.02 | 3.27 | 9.9E+10 | 0.38 | 81 | SmAl$_{11}$O$_{18}$•Al$_5$O$_5$N | 1.0 |
| COMPARATIVE EXAMPLE 5 | 1.56 | — | 4.53 | 0.00 | 3.29 | 1.4E+11 | 0.65 | 65 | EuAl$_{12}$O$_{19}$•Al$_5$O$_5$N | *2 |
| COMPARATIVE EXAMPLE 6 | 0.73 | — | 6.75 | 0.01 | 3.39 | 1.0E+10 | 0.38 | 62 | ReAl$_{11-12}$O$_{18-19}$(Re: Sm•Eu)•Al$_5$O$_6$N | 1.7 |
| COMPARATIVE EXAMPLE 7 | 1.25 | 1.91 | 6.87 | 0.06 | 3.39 | 1.7E+10 | 0.39 | 65 | ReAl$_{11-12}$O$_{18-19}$(Re: Sm•Eu)•Al$_5$O$_6$N | 1.8 |
| COMPARATIVE EXAMPLE 8 | 1.86 | 2.08 | 3.81 | 0.01 | 3.36 | 4.7E+12 | 0.73 | 67 | EuAl$_{12}$O$_{19}$•EuAl$_2$O$_4$•Al$_5$O$_6$N•TiN | *2 |
| COMPARATIVE EXAMPLE 9 | 1.58 | 2.49 | 4.39 | 0.00 | 3.36 | 5.0E+11 | 0.52 | 60 | EuAl$_{12}$O$_{19}$•EuAl$_2$O$_4$•TiN | *2 (0.9) |
| COMPARATIVE EXAMPLE 10 | 2.89 | 0.55 | 7.68 | 0.01 | 3.41 | 1.1E+15 | 0.69 | 68 | EuAl$_{12}$O$_{19}$•Al$_5$O$_6$N•Al$_9$O$_3$N$_7$•TiN | 1.9 |

*1: not measured due to overlapping of 107 peak with another peak.
*2: measurement was difficult due to vague peak Examples 2 to 13 and Comparative Examples 1 to 10

Aluminum nitride sintered products of Examples 2 to 13 and Comparative Examples 1 to 10 were produced so as to have the compositions in Table 1 and under the firing conditions in Table 1 in a manner similar to that in Example 1. The resultant sintered products were measured in terms of the above-described items in the same manner as in Example 1. The measurement results are shown in Table 2.

Specifically, as to Examples 1 to 10, standard hot-press firing was conducted. The firing atmosphere for Examples in which the maintaining time was 4 hours was controlled to be the same as in Example 1. As for Examples in which the maintaining time was 2 hours, a vacuum was used while the temperature was increased from room temperature to 1550° C. and nitrogen gas at 1.5 kgf/cm² was introduced while the temperature was increased from 1550° C. to the hot-press firing temperature and the hot-press firing temperature was maintained. As for Examples 11 to 13, products having the same compositions as in Examples 6 to 8 were subjected to hot-press firing and subsequently to an annealing treatment. Specifically, the pressure applied by the pressing was 100 kgf/cm², the hot-press firing temperature was 1875° C. and this temperature was maintained for 2 hours. As for the firing atmosphere, a vacuum was used while the temperature was increased from room temperature to 1550° C. and nitrogen gas at 1.5 kgf/cm² was introduced while the temperature was increased from 1550° C. to the hot-press firing temperature and the hot-press firing temperature was maintained. After that, the pressure applied by the pressing was gradually decreased ultimately to zero while the temperature was increased to 1900° C. and this temperature was maintained for 2 hours.

[Evaluation]

As is obvious from Tables 1 and 2, the aluminum nitride sintered products of Examples 1 to 13 had a volume resistivity of $1\times10^{12}$ Ω·cm or less at room temperature and an activation energy (Ea) of 0.5 eV or less. In particular, the aluminum nitride sintered products of Examples 11 to 13 provided good results in which the volume resistivity was $1\times10^{11}$ Ω·cm or less at room temperature and the activation energy (Ea) was 0.4 eV or less. Although the sintered product of Example 6 and the sintered product of Example 11 had the same composition, the former was subjected to the standard hot-press firing and the latter was subjected to the hot-press firing and the annealing treatment. SEM photographs of these products are shown in FIG. 1. As is obvious from FIG. 1, although the grain boundary phases are continuous in Example 6, the grain boundary phases are more abundant in Example 11. In the SEM photographs, pale gray fine particles correspond to titanium nitride, bright white portions correspond to $EuAl_2O_4$ (scarce), and gray continuous phases correspond to conductive $EuAl_{12}O_{19}$. Note that $EuAl_2O_4$ is composed of elements of Eu, Al, and O, and has a crystal phase having peaks in substantially the same positions as in $SrAl_2O_4$ in XRD.

The aluminum nitride sintered product of Comparative Example 1, in which europium oxide alone was added, had a volume resistivity of more than $1\times10^{12}$ Ω·cm.

The aluminum nitride sintered product of Comparative Example 2, in which Samarium oxide alone was added, had a volume resistivity of $1\times10^{12}$ Ω·cm or less at room temperature and an activation energy (Ea) of 0.5 eV or less as in Examples 1 to 13. Comparative Examples 1 and 2 show that although samarium and europium are both rare-earth elements and have atomic numbers adjacent to each other, replacing samarium with europium does not provide an aluminum nitride sintered product having properties equivalent to those of an aluminum nitride sintered product containing samarium.

The aluminum nitride sintered products of Comparative Examples 3 and 5, in which europium oxide and aluminum oxide were added and titanium oxide was not added, had an activation energy (Ea) of more than 0.5 eV. As for Comparative Example 3, the volume resistivity was more than $1\times10^{12}$ Ω·cm.

The aluminum nitride sintered product of Comparative Example 4, in which samarium oxide and aluminum oxide were added and titanium oxide was not added, had a volume resistivity of $1\times10^{12}$ Ω·cm or less at room temperature and an activation energy (Ea) of 0.5 eV or less as in Examples 1 to 13. Comparative Examples 3 and 4 also show that replacing samarium with europium does not provide an aluminum nitride sintered product having properties equivalent to those of an aluminum nitride sintered product containing samarium.

The aluminum nitride sintered product of Comparative Example 6, in which samarium oxide, europium oxide, and aluminum oxide were added, had a volume resistivity of $1\times10^{12}$ Ω·cm or less at room temperature and an activation energy (Ea) of 0.5 eV or less as in Examples 1 to 13. These properties were presumably obtained as a result of addition of samarium oxide.

The aluminum nitride sintered product of Comparative Example 7, in which samarium oxide, europium oxide, aluminum oxide, and titanium nitride were added, had a volume resistivity of $1\times10^{12}$ Ω·cm or less at room temperature and an activation energy (Ea) of 0.5 eV or less as in Examples 1 to 13. Such good results were obtained in spite of addition of titanium nitride presumably because samarium oxide was added.

The aluminum nitride sintered product of Comparative Example 8, in which europium oxide, aluminum oxide, and titanium nitride were added, had a volume resistivity of more than $1\times10^{12}$ Ω·cm at room temperature and an activation energy (Ea) of more than 0.5 eV. Thus, a system in which samarium oxide is not added does not provide good results in spite of addition of titanium nitride. Unlike titanium oxide, titanium nitride is not involved in reactions upon firing and remains in the original form and presumably does not contribute to generation of conductive $EuAl_{12}O_{19}$ forming grain boundary phases.

The aluminum nitride sintered product of Comparative Example 9, in which europium oxide, aluminum oxide, and titanium oxide were added, had an activation energy (Ea) of more than 0.5 eV. This is presumably because the molar ratio of titanium oxide to aluminum oxide was 1.44, which exceeded the upper limit of the appropriate range (0.05 to 1.2).

Figure 2:
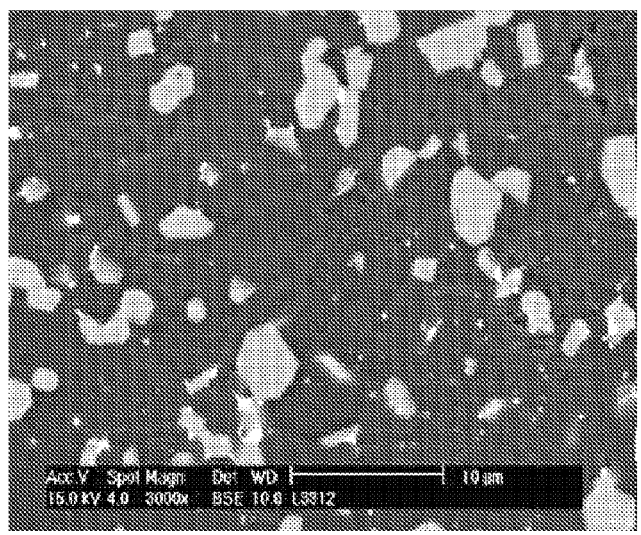
FIG. 2 shows a SEM image of a section of an aluminum nitride sintered product of Comparative Example 10.

The aluminum nitride sintered product of Comparative Example 10, which corresponds to Example 11 but was not subjected to the annealing treatment, had a volume resistivity of more than $1\times10^{12}$ Ω·cm at room temperature and an activation energy (Ea) of more than 0.5 eV. A SEM photograph of this sintered product is shown in FIG. 2. As is obvious from FIG. 2, although this sintered product is densified as a result of the hot-press firing, grain boundary phases are not continuous. This is probably the cause that the volume resistivity at room temperature was extremely high.

Figure 3:
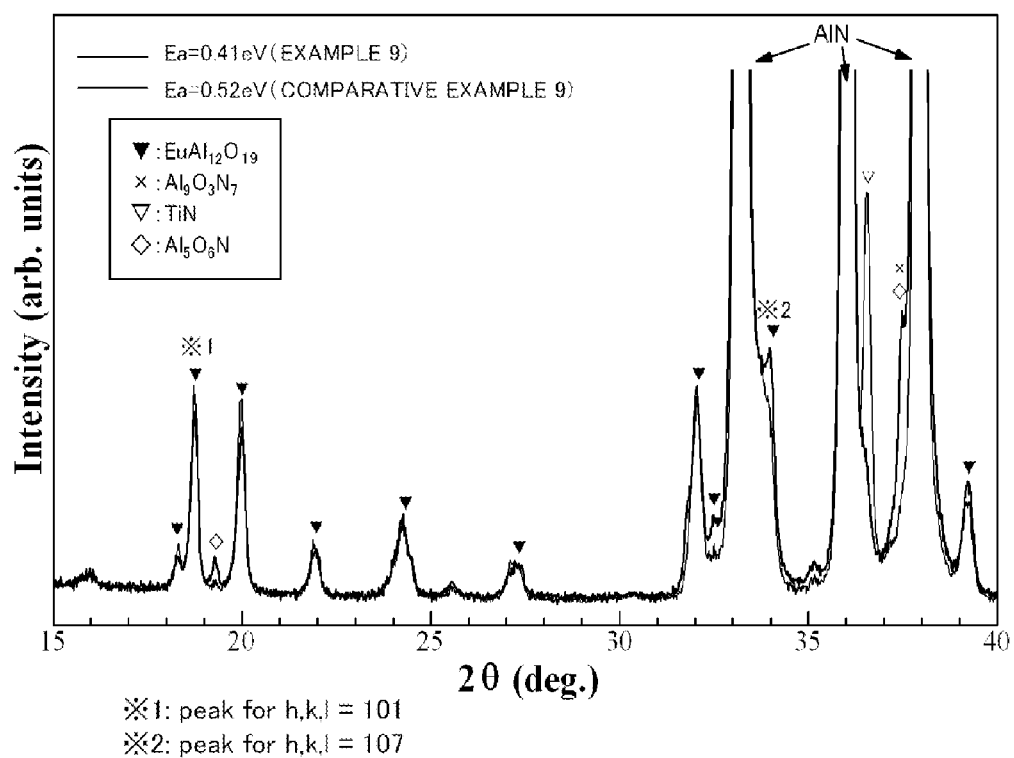
FIG. 3 shows XRD profiles of Example 9 and Comparative Example 9.

Example 9 had an activation energy (Ea) of 0.41 eV and Comparative Example 9 had an activation energy (Ea) of 0.52 eV. XRD profiles of Example 9 and Comparative Example 9 are shown in FIG. 3. As is obvious from FIG. 3, although the intensities of peaks of $EuAl_{12}O_{19}$ are substantially the same between Example 9 and Comparative Example 9, a peak at about 34° (peak for h, k, l=107; hereafter, simply referred to as 107 peak) of Example 9 has higher intensity than that in Comparative Example 9. In summary, when the activation energy (Ea) is low, the ratio of the intensity of a peak of $EuAl_{12}O_{19}$ to the intensity of the 107 peak becomes large, and 107 peak/101 peak, which is a ratio of the 107 peak to the 101 peak (peak for h, k, l=101 and present at about 19°) of $EuAl_{12}O_{19}$, is 1 or more. In contrast, when the activation energy (Ea) is high, the 107 peak is extremely weak and is under the peak of aluminum nitride and does not clearly appear, or 107 peak/101 peak is 1 or less. The values of 107 peak/101 peak of Examples and Comparative Examples are also shown in Table 2.

The present application claims priority from the Japanese Patent Application No. 2008-297438 filed on Nov. 21, 2008, the entire contents of which are incorporated herein by reference.

What is claimed is:

1. A method for producing an aluminum nitride sintered product comprising the steps of:
   (a) preparing a powder mixture that contains aluminum nitride, 2 to 10 parts by weight of europium oxide with respect to 100 parts by weight of aluminum nitride, aluminum oxide such that a molar ratio of aluminum oxide to europium oxide is 2 to 10, and titanium oxide such that a molar ratio of titanium oxide to aluminum oxide is 0.05 to 1.2, but not a samarium compound;
   (b) producing a compact from the powder mixture; and
   (c) firing the compact by (1) subjecting the compact to hot-press firing in a vacuum or in an inert atmosphere or (2) subjecting the compact to hot-press firing in a vacuum or in an inert atmosphere and subsequently to an annealing treatment at a temperature higher than a temperature in the firing.

2. The method for producing an aluminum nitride sintered product according to claim 1,
wherein, in the step (a) of preparing the powder mixture, 3 to 5 parts by weight of europium oxide is used with respect to 100 parts by weight of aluminum nitride.

3. An aluminum nitride sintered product produced by the method for producing an aluminum nitride sintered product according to claim 1.

4. An aluminum nitride sintered product according to claim 3,
wherein the aluminum nitride sintered product contains aluminum nitride as a main component; includes a continuous grain boundary phase having peaks corresponding to $EuAl_{12}O_{19}$ and a crystal phase having peaks corresponding to TiN, but not a crystal phase containing Sm; has a volume resistivity of $1\times10^{12}\Omega\cdot cm$ or less at 500 V/mm at room temperature; and has an activation energy (Ea) of 0.5 eV or less, the activation energy being obtained on the basis of a variation in volume resistivity from room temperature to 300° C.

5. An aluminum nitride sintered product that contains aluminum nitride as a main component; includes a continuous grain boundary phase having peaks corresponding to $EuAl_{12}O_{19}$ and a crystal phase having peaks corresponding to TiN, but not a crystal phase containing Sm; has a volume resistivity of $1\times10^{12}\Omega\cdot cm$ or less at 500 V/mm at room temperature; and has an activation energy (Ea) of 0.5 eV or less, the activation energy being obtained on the basis of a variation in volume resistivity from room temperature to 300° C.

6. An electrostatic chuck produced with the aluminum nitride sintered product according to claim 3.

7. An electrostatic chuck produced with the aluminum nitride sintered product according to claim 4.

8. An electrostatic chuck produced with the aluminum nitride sintered product according to claim 5.

* * * * *